United States Patent
Zou et al.

(10) Patent No.: US 11,996,824 B2
(45) Date of Patent: May 28, 2024

(54) RESONATOR, FILTER AND DUPLEXER

(71) Applicant: Wuhan MEMSonics Technologies Co., Ltd., Wuhan (CN)

(72) Inventors: Yang Zou, Wuhan (CN); Yan Liu, Wuhan (CN); Yao Cai, Wuhan (CN); Chengliang Sun, Wuhan (CN); Bowoon Soon, Singapore (SG)

(73) Assignee: Wuhan MEMSonics Technologies Co., Ltd., Wuhan (CN)

( * ) Notice: Subject to any disclaimer, the term of this patent is extended or adjusted under 35 U.S.C. 154(b) by 0 days.

(21) Appl. No.: 17/949,240

(22) Filed: Sep. 21, 2022

(65) Prior Publication Data
US 2023/0093762 A1 Mar. 23, 2023

(30) Foreign Application Priority Data
Sep. 23, 2021 (CN) .......................... 202111115855.5

(51) Int. Cl.
*H03H 9/17* (2006.01)
*H03H 3/04* (2006.01)
(Continued)

(52) U.S. Cl.
CPC .............. *H03H 9/172* (2013.01); *H03H 3/04* (2013.01); *H03H 9/564* (2013.01); *H03H 9/706* (2013.01)

(58) Field of Classification Search
CPC .......... H03H 9/172; H03H 3/04; H03H 9/564; H03H 9/706; H03H 2003/0428;
(Continued)

(56) References Cited

U.S. PATENT DOCUMENTS

| 7,489,063 B2 * | 2/2009 | Isobe | H03H 9/605 310/365 |
| 7,675,389 B2 * | 3/2010 | Yamakawa | H03H 9/605 333/133 |

(Continued)

FOREIGN PATENT DOCUMENTS

| CN | 110868184 A | 3/2020 |
| CN | 111988006 A | 11/2020 |

(Continued)

OTHER PUBLICATIONS

Corresponding CN first search results dated Oct. 28, 2022.

*Primary Examiner* — Andrea Lindgren Baltzell
*Assistant Examiner* — Kimberly E Glenn
(74) *Attorney, Agent, or Firm* — Samson G. Yu

(57) ABSTRACT

A resonator, a filter and a duplexer, which relate to the technical field of resonators. The resonator includes: a substrate, and a lower electrode layer, a piezoelectric layer and an upper electrode layer, which are sequentially formed on the substrate, wherein an acoustic reflection structure is formed on a surface of the substrate that is close to the lower electrode layer, and an overlapping region of the acoustic reflection structure, the lower electrode layer, the piezoelectric layer and the upper electrode layer along a stacking direction forms a resonant region; and in the resonant region, the surface, which is away from the substrate, of at least one of the lower electrode layer, the piezoelectric layer and the upper electrode layer is etched to form an etched region, the depth of the etched region is less than the thickness of an etched layer, and the area of the etched region is less than the area of the resonant region. By means of controlling an etching area ratio of the resonant region to the etched region, the resonator can obtain a plurality of different resonant frequencies on the same wafer without increasing processes.

20 Claims, 6 Drawing Sheets

(51) Int. Cl.
*H03H 9/56* (2006.01)
*H03H 9/70* (2006.01)

(58) Field of Classification Search
CPC ....... H03H 2003/0435; H03H 9/02015; H03H 9/132; H03H 9/02118; H03H 9/173; H03H 9/0211; H03H 9/17; H03H 9/54
See application file for complete search history.

(56) References Cited

U.S. PATENT DOCUMENTS

| | | | |
|---|---|---|---|
| 10,069,478 B2* | 9/2018 | Shimomura | ........... H03H 9/564 |
| 2018/0138885 A1* | 5/2018 | Stokes | ............... H03H 9/02047 |

FOREIGN PATENT DOCUMENTS

| | | |
|---|---|---|
| CN | 212381184 U | 1/2021 |
| JP | 2005117641 A | 4/2005 |
| JP | 2018182463 A | 11/2018 |
| WO | 2021135015 A1 | 7/2021 |

* cited by examiner

RESONATOR, FILTER AND DUPLEXER

CROSS-REFERENCE TO RELATED APPLICATION

The present disclosure claims the priority of Chinese Patent Application CN202111115855.5, filed in China on Sep. 23, 2021, and entitled "Resonator, Filter And Duplexer", the entire contents of which are herein incorporated by reference.

TECHNICAL FIELD

The present disclosure relates to the technical field of resonators, and in particular, to a resonator, a filter and a duplexer.

BACKGROUND

Along with the development of communication systems, the center frequencies of communication devices have been greatly improved, so that the communication systems also have higher requirements on the performance, size and other aspects of frequency selection devices, namely, filters, and the miniaturization and integration of the communication systems also become an inevitable trend of system development.

Taking a filter constructed by bulk acoustic wave resonators as an example, the filter realizes the filtering of signals by means of a topological structure, which is formed by connecting a plurality of bulk acoustic wave resonators in series and in parallel, therefore the resonant frequencies of the resonators in the filter directly affect a passband position of the filter, that is, the resonant frequencies of the resonators have a direct impact on the filtering effect of the filter. In order to achieve a better filtering effect of the filter, mass load layers are additionally arranged on top electrodes of some resonators at present. However, in the traditional mode of realizing frequency modulation of the resonator by increasing mass loads, one more mass load layer needs to be correspondingly increased for one more frequency, that is, one more photoetching plate needs to be correspondingly used, such that production costs, including the cost of the photoetching plate and the processing cost of a multi-step process, are increased; and on the other hand, limited by processing accuracy, frequency errors between different mass load layers increase, which will severely deteriorate the performance of the filter.

SUMMARY

The purpose of the present disclosure is to provide a resonator, a filter and a duplexer, which can obtain, by means of controlling an etching area ratio of a resonant region to an etched region, a plurality of different resonant frequencies on the same wafer without increasing processes.

Embodiments of the present disclosure are implemented as follows:

One aspect of the present disclosure provides a resonator, including: a substrate, and a lower electrode layer, a piezoelectric layer and an upper electrode layer, which are sequentially formed on the substrate, wherein an acoustic reflection structure is formed on a surface of the substrate that is close to the lower electrode layer, and an overlapping region of the acoustic reflection structure, the lower electrode layer, the piezoelectric layer and the upper electrode layer along a stacking direction forms a resonant region; and in the resonant region, a surface, which is away from the substrate, of at least one of the lower electrode layer, the piezoelectric layer and the upper electrode layer is etched to form an etched region, the depth of the etched region is less than the thickness of an etched layer, and the area of the etched region is less than the area of the resonant region. By means of controlling an etching area ratio of the resonant region to the etched region, the resonator can obtain a plurality of different resonant frequencies on the same wafer without increasing processes.

Optionally, the etched region is located at the periphery of the resonant region; and in the resonant region, a contour of an orthographic projection of an unetched region on the substrate is any one of a circle, a closed graph composed of a plurality of arcs, or a polygon.

Optionally, in the resonant region, a contour of an orthographic projection of an unetched region on the substrate is a plurality of closed graphs, which are arranged at intervals.

Optionally, the etched region is located in a middle region of the resonant region, and a contour of an orthographic projection of the etched region on the substrate is any one of a circle, a closed graph composed of a plurality of arcs, or a polygon.

Optionally, the etched region includes a plurality of sub-regions arranged at intervals, and the contour of the orthographic projection of the sub-region on the substrate is any one or a combination of at least two of a circle, a closed graph composed of a plurality of arcs, or a polygon.

Optionally, in the resonant region, surfaces of the upper electrode layer and the piezoelectric layer, which are respectively away from the substrate, are partially etched.

Optionally, in the resonant region, the surfaces of the upper electrode layer, the piezoelectric layer and the lower electrode layer, which are respectively away from the substrate, are partially etched.

Optionally, in the resonant region, the piezoelectric layer is partially etched to form the etched region, and the etched region is filled with a material having a positive temperature coefficient.

Optionally, the upper electrode layer is provided with an inclination angle, and the inclination angle ranges from 80° to 90°

Optionally, the lower electrode layer is provided with an inclination angle, and the inclination angle ranges from 15° to 30°.

Optionally, the etched region includes a plurality of sub-regions that are spaced apart from each other and are arranged in parallel, and the spacing between the sub-regions is greater than or equal to half of the length of the sub-region.

Optionally, there are two or more etched layers, and areas of the etched regions of the etched layers are equal.

Optionally, the projections of the etched regions on the substrate overlap with each other.

Another aspect of the present disclosure provides a filter, including at least two resonators mentioned above, wherein the at least two resonators are respectively in respective resonant regions, and an area ratio of an etched area and an unetched area of each of the at least two resonators is different from each other.

Optionally, the etched region includes a plurality of sub-regions that are spaced apart from each other and are arranged in parallel, and the spacing between the sub-regions is greater than or equal to half of the length of the sub-region.

Optionally, there are two or more etched layers, and areas of the etched regions of the etched layers are equal.

Optionally, the projections of the etched regions on the substrate overlap with each other.

Optionally, the lower electrode layer is provided with an inclination angle, and the inclination angle ranges from 15° to 30°.

Optionally, the upper electrode layer is provided with an inclination angle, and the inclination angle ranges from 80° to 90°.

Yet another aspect of the present disclosure provides a duplexer, including a transmitting filter and a receiving filter, wherein the transmitting filter and/or the receiving filter is the above filter.

The beneficial effects of the present disclosure include:

The resonator provided by the present disclosure includes a substrate, and a lower electrode layer, a piezoelectric layer and an upper electrode layer, which are sequentially formed on the substrate, wherein an acoustic reflection structure is formed on the surface of the substrate that is close to the lower electrode layer, and an overlapping region of the acoustic reflection structure, the lower electrode layer, the piezoelectric layer and the upper electrode layer along a stacking direction forms a resonant region; and in the resonant region, the surface, which is away from the substrate, of at least one of the lower electrode layer, the piezoelectric layer and the upper electrode layer is etched to form an etched region, the depth of the etched region is less than the thickness of an etched layer, and the area of the etched region is less than the area of the resonant region. In this way, by means of the present disclosure, the area ratio of the etched region to the unetched region in the resonant region can be controlled as needed, so as to obtain a plurality of different resonant frequencies on the same wafer without increasing processes, thereby effectively improving the flexibility of designing the filter and the duplexer. In addition, in the present disclosure, since only at least one of the piezoelectric layer, the lower electrode layer or the upper electrode layer in the resonant region is etched, the upper electrode layer, the lower electrode layer and the piezoelectric layer outside the resonant region can be retained, such that an electrode loss can be reduced to a certain extent, and a Q value can be increased

BRIEF DESCRIPTION OF THE DRAWINGS

To illustrate technical solutions in the embodiments of the present disclosure more clearly, a brief introduction on the drawings which are needed in the embodiments is given below. It should be understood that the following drawings only show some embodiments of the present disclosure, and thus should not be regarded as limitations to the scope. For those of ordinary skill in the art, other related drawings may also be obtained according to these drawings without creative efforts.

Figure 1:
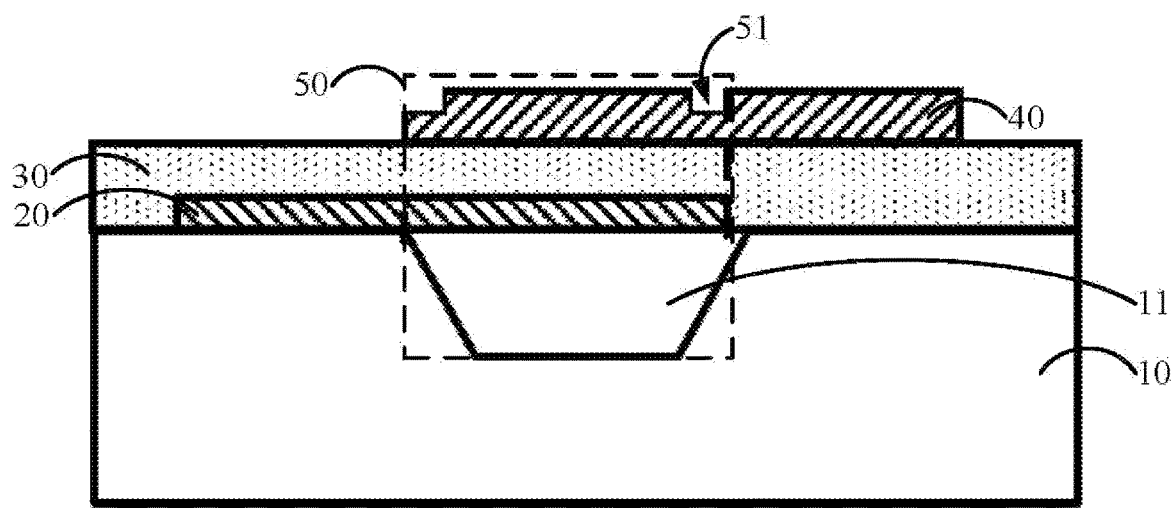
FIG. 1 is a first schematic structural diagram of a resonator provided by some embodiments of the present disclosure.

Reference signs: 10—substrate; 11—acoustic reflection structure; 20—lower electrode layer; 30—piezoelectric layer; 40—upper electrode layer; 50—resonant region; 51—etched region; 511—sub-region; 52—unetched region; 60—first material; 200—transmitting filter; 300—receiving filter; 400—antenna; 500—phase shifter.

DETAILED DESCRIPTION OF THE EMBODIMENTS

The embodiments set forth below represent necessary information for enabling those skilled in the art to practice the embodiments, and optimal modes for practicing the embodiments are illustrated. After reading the following descriptions with reference to the drawings, those skilled in the art will understand the concepts of the present disclosure, and will recognize disclosures of these concepts that are not specifically set forth herein. It should be understood that, these concepts and disclosures, are within the scope of the present disclosure and appended claims.

It should be understood that, although the terms first, second and the like may be used herein to describe various elements, these elements should not be limited by these terms. These terms are only used to distinguish one element from another. For example, without departing from the scope of the present disclosure, a first element may be called a second element, and similarly, a second element may be called a first element. As used herein, the terms "and/or" include any and all combinations of one or more of associated listed items.

It should be understood that, when one element (such as a layer, a region or a substrate) is referred to as "being on another element" or "extending onto another element", it may be directly on the other element or directly extend onto the other element, or there may also be an intervening element. In contrast, when one element is referred to as "being directly on another element" or "directly extending onto another element", there is no intervening element. Similarly, it should be understood that, when one element (such as, a layer, a region or a substrate) is referred to as "being on another element" or "extending on another element", it may be directly on the other element or directly extend on the other element, or there may also be an intervening element. In contrast, when one element is referred to as "being directly on another element" or "directly extending on another element" there is no intervening element. It should also be understood that, when one element is referred to as being "connected" or "coupled" to another element, it may be directly connected or coupled to the other element, or there may be an intervening element. In contrast, when one element is referred to as being "directly connected" or "directly coupled" to another element, there is no intervening element.

Relative terms such as "below" or "above" or "upper" or "lower" or "horizontal" or "vertical" may be used herein to describe the relationship between one element, layer or region and another element, layer or region, as shown in the figures. It should be understood that, these terms and those terms discussed above are intended to encompass different orientations of the device in addition to the orientations depicted in the figures.

The terms used herein are for the purpose of describing particular embodiments only and are not intended to limit the present disclosure. As used herein, singular forms "a," "one," and "the" are intended to include plural forms as well, unless the context clearly dictates otherwise. It should also be understood that, when used herein, the term "include" indicates the presence of stated features, integers, steps, operations, elements and/or components, but does not preclude the presence or addition of one or more other features, integers, steps, operations, elements, components and/or groups of the foregoing.

Unless otherwise defined, all terms (including technical and scientific terms) used herein have the same meanings as commonly understood by those of ordinary skill in the art to which the present disclosure belongs. It should also be understood that, the terms used herein are to be construed to have the same meanings as they have in the present specification and related arts, and are not to be construed in an idealized or overly formal sense, unless explicitly defined as such herein.

Figure 2:
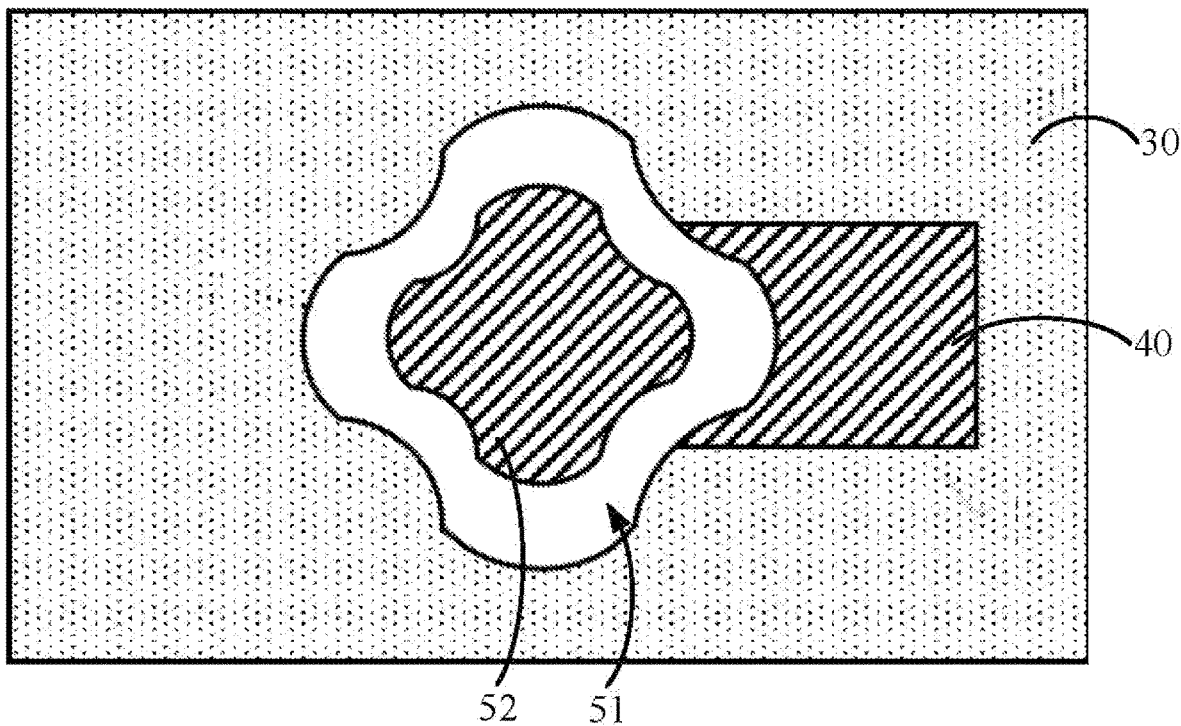
FIG. 2 is a top view of FIG. 1.

Please refer to FIG. 1 and FIG. 2, the present embodiment provides a resonator, including a substrate 10, and a lower electrode layer 20, a piezoelectric layer 30 and an upper electrode layer 40, which are sequentially formed on the substrate 10, wherein an acoustic reflection structure 11 is formed on a surface of the substrate 10 that is close to the lower electrode layer 20, and an overlapping region of the acoustic reflection structure 11, the lower electrode layer, the piezoelectric layer 30 and the upper electrode layer along a stacking direction forms a resonant region 50; and in the resonant region 50, the surface, which is away from the substrate 10, of at least one of the lower electrode layer, the piezoelectric layer 30 and the upper electrode layer is etched to form an etched region 51, the depth of the etched region 51 is less than the thickness of an etched layer, and the area of the etched region 51 is less than the area of the resonant region 50.

In the present embodiment, the lower electrode layer 20, the piezoelectric layer 30 and the upper electrode layer 40 are sequentially formed on the substrate 10, and the acoustic reflection structure 11 is formed on the surface of the substrate 10 that is close to the lower electrode layer 20. Exemplarily, the acoustic reflection structure 11 may be a cavity or a Bragg reflection structure, which is not limited in the present disclosure. In the present embodiment, the materials of the lower electrode layer 20, the piezoelectric layer 30 and the upper electrode layer 40 are not limited in the present disclosure, and those skilled in the art may choose any material, which is suitable for the resonator, for each layer as needed.

As shown in FIG. 1, the resonant region 50 is an overlapping region of the upper electrode layer 40, the piezoelectric layer 30, the lower electrode layer 20 and the acoustic reflection structure 11 along, the stacking direction of the resonator, and the resonant region 50 is a region where acoustic wave reflection is generated. The working principle thereof is well known to those skilled in the art, and thus will not be repeated in the present disclosure.

Please refer to FIG. 1 and FIG. 2, in the present embodiment, in the resonant region 50, the surface, which is away from the substrate 10, of at least one of the lower electrode layer 20, the piezoelectric layer 30 and the upper electrode layer 40 is etched to form the etched region 51. It should be noted that, FIG. 1 and FIG. 2 show a situation when the currently etched layer is the upper electrode layer 40, which is only an example and not a limitation to the present disclosure. In other embodiments, the piezoelectric layer 30 or the lower electrode layer 20 may also be etched, or any two of the upper electrode layer 40, the piezoelectric layer 30 and the lower electrode layer 20 are etched (that is, two of the layers are etched to form two etched regions 51) or all the upper electrode layer 40, the piezoelectric layer 30 and the lower electrode layer 20 are etched (that is, the upper electrode layer 40, the lower electrode layer 20 and the piezoelectric layer 30 are all etched to form three etched regions 51).

It should also be noted that, in the resonant region 50, the etching position of the etched layer is located on the surface of the layer that is away from the substrate 10. For example, as shown in FIG. 1, when the etched layer is the upper electrode layer 40, the surface of the upper electrode layer 40 that is away from the substrate 10 is etched toward the surface that is close to the substrate 10.

In addition, the depth of the etched region 51 is less than the thickness of the etched layer. Exemplarily, as shown in FIG. 1, when the etched layer is the upper electrode layer 40, the depth of the etched region 51 of the upper electrode layer 40 is less than the thickness of the upper electrode layer 40 and when the etched layers are the upper electrode layer 40 and the piezoelectric layer 30, the depth of the etched region 51 of the upper electrode layer 40 is less than the thickness of the upper electrode layer 40, and the etching depth of the piezoelectric layer 30 is also less than the thickness of the piezoelectric layer 30. Similarly, when the etched layers are the other layers, those skilled in the art may perform reasonable deduction according to the above examples, and thus not be repeated in the present disclosure. In other words, when two or three layers are etched, the etching depth of each etched layer is less than the thickness of the etched layer itself.

In addition, in the present embodiment, the area of the etched region 51 is less than the area of the resonant region 50. Corresponding to different cases, examples are given below. When the etched layer is the upper electrode layer 40, in the resonant region 50, the area of the etched region 51 of the upper electrode layer 40 is less than the area of the resonant region 50; and when the etched layers are the upper electrode layer 40 and the piezoelectric layer 30, in the resonant region 50, the area of the etched region 51 of the upper electrode is less than that of the resonant region 50, and the area of the etched region 51 of the piezoelectric layer 30 is also less than that of the resonant region 50. That is, when two or three layer are etched, the area of the etched region 51 of each etched layer should be less than that of the resonant region 50.

The lower electrode layer 20 is provided with an inclination angle, and the inclination angle ranges from 15° to 30°.

The etched region 51 includes a plurality of sub-regions 511 that are spaced apart from each other and are arranged in parallel, and the spacing between the sub-regions 511 is greater than or equal to half of the length of the sub-region 511.

There are two or more etched layers, and areas of the etched regions of the etched layers are equal.

The projections of the etched regions 511 on the substrate 10 overlap with each other.

When the etched layer is the lower electrode layer 20, an inclination angle is reserved in an unetched region by using inductively coupled plasma (ICP) etching and by means of adjusting parameters. In order to ensure the deposition quality of the piezoelectric layer 30, the inclination angle of the lower electrode layer 20 ranges from 15° to 30°, and the etching temperature ranges from 0° C. to 200° C. In addition, after the lower electrode layer 20 is etched, a surface treatment needs to be performed on the lower electrode layer 20, so as to reduce the surface roughness thereof. When the etched layer is the piezoelectric layer 30, taking piezoelectric AlN as an example, Ar and Cl2 are used as etching gases, a reaction gas is decomposed by using an inductively coupled plasma source, so as to separate a plasma source from, a radio-frequency acceleration source, such that the plasma density is higher, and the acceleration capability is stronger. Accordingly, a higher etching rate is obtained, and better anisotropic etching is realized. In addition, in order to ensure that the AlN surface of the piezoelectric layer 30 is not corroded by a developing solution, a hard mask, such as $SiO_2$, is required, and the etching temperature ranges from 0° C. to 200° C. When the etched layer is the upper electrode layer 40, by means of adjusting the parameters, the inclination angle of the unetched region ranges from 80° to 90°, and preferably 90°. When the edge of the upper electrode layer 40 is 90°, acoustic waves on the edge may be well reflected, and a Q value of the resonator is thus improved.

To sum up, the resonator provided by the present disclosure includes a substrate 10, and a lower electrode layer 20, a piezoelectric layer 30 and an upper electrode layer 40, which are sequentially formed on the substrate 10, wherein an acoustic reflection structure 11 is formed on a surface of the substrate 10 that is close to the lower electrode layer 20, and an overlapping region of the acoustic reflection structure 11, the lower electrode layer, the piezoelectric layer 30 and the upper electrode layer along a stacking direction forms a resonant region 50; and in the resonant region 50, a surface, which is away from the substrate 10, of at least one of the lower electrode layer, the piezoelectric layer 30 and the upper electrode layer is etched to form an etched region 51, the depth of the etched region 51 is less than the thickness of an etched layer, and the area of the etched region 51 is less than the area of the resonant region 50. In this way, by means of the present disclosure, the area ratio of the etched region 51 to the unetched region 52 in the resonant region 50 can be controlled as needed, so as to obtain a plurality of different resonant frequencies on the same wafer without increasing processes, thereby effectively improving the flexibility of designing a filter and a duplexer. In addition, in the present disclosure, since only at least one of the piezoelectric layer 30, the lower electrode layer 20 or the upper electrode layer 40 in the resonant region 50 is etched, the upper electrode layer 40, the lower electrode layer 20 and the piezoelectric layer 30 outside the resonant region 50 can be retained, such that an electrode loss can be reduced to a certain extent, and the Q value can be increased.

Figure 5:
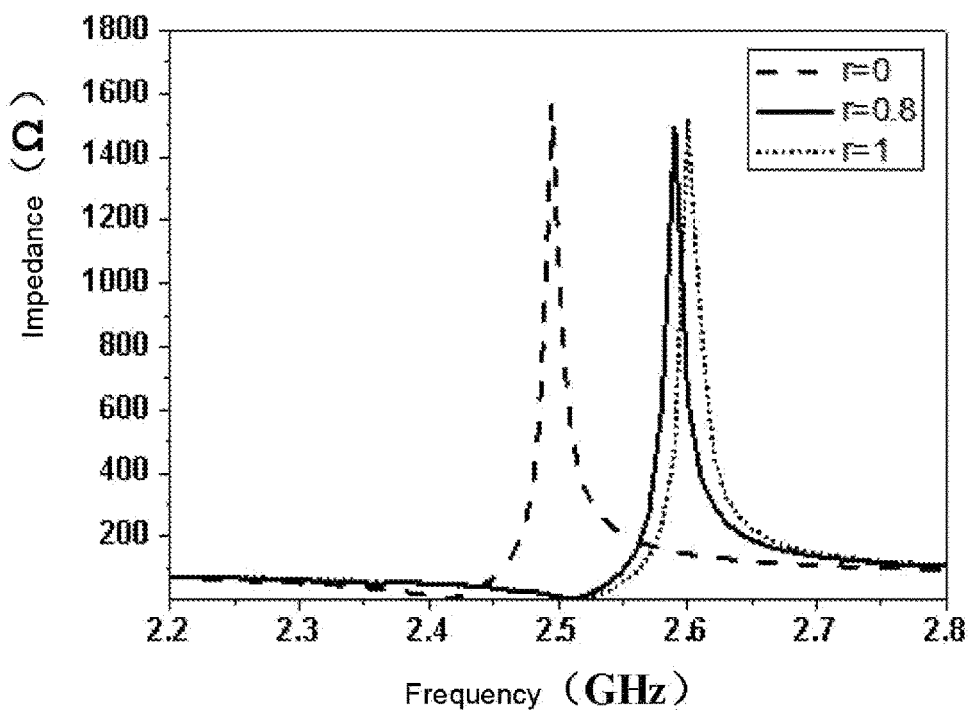
FIG. 5 is an impedance curve diagram corresponding to the resonator provided in FIG. 1.

Please refer to FIG. 5, which is an impedance curve diagram of the resonator corresponding to FIG. 1, wherein r represents an etching area ratio (that is, the ratio of the area of the etched region 51 of the upper electrode layer 40 to the area of the resonant region 50). A dotted line in FIG. 5 corresponds to the resonator in which the etching ratio is r=0 (i.e., an unetched resonant region 50), and a solid line corresponds to the resonator in which the etching ratio is r=0.8 (i.e., the area of the etched region 51 is less than that of the resonant region 50), and a dash-dotted line corresponds to the resonator in which the etching ratio is r=1 (i.e., the area of the etched region 51 is equal to that of the resonant region 50). It can be seen from the curve shown in FIG. 5 that, the greater the etching area ratio of the upper electrode layer 40 of the resonant region 50 is, the higher the resonator frequency of the resonator is. Therefore, in the present disclosure, by means of controlling the ratio of the area of the etched region 51 of the resonator to the area of the resonant region 50, different resonant frequencies, can be obtained on the same wafer, thereby increasing the degrees of freedom of designing the filter and the duplexer.

Since the shape of the etched region 51 includes a variety of cases, for the convenience of description and understanding, the present disclosure will give an exemplary introduction in the form of examples.

Exemplarily, in a first case, the etched region 51 is located at the periphery of the resonant region 50: and in the resonant region 50, a contour of an orthographic projection of the unetched region 52 on the substrate 10 is any one of a circle, a closed graph composed of a plurality of arcs, or a polygon. That is, in the resonant region 50, the etched region 51 surrounds the unetched region 52, as shown in FIG. 2.

In this case, the etched region 51 is annular, and the unetched region 52 is in the shape of a region that is clad by the etched region 51. As shown in FIG. 2, for example, the contour of the orthographic projection of the unetched region 52 on the substrate 10 is a closed graph, which is formed by enclosing eight arcs, and the etched region 51 is in the shape of a closed graph in which an inner ring and an outer ring are both enclosed by eight arcs. Of course, FIG. 2 is only an example, and in other embodiments, the unetched region 52 may also be a circle or a polygon, or even, an irregular closed graph or the like.

Figure 3:
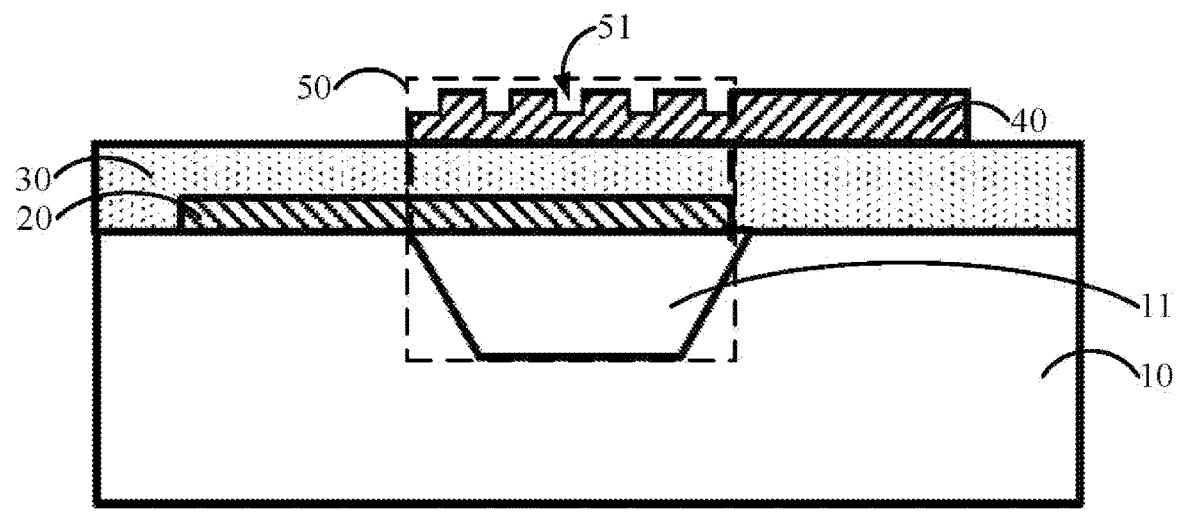
FIG. 3 is a second schematic structural diagram of a resonator provided by some embodiments of the present disclosure.
Figure 4:
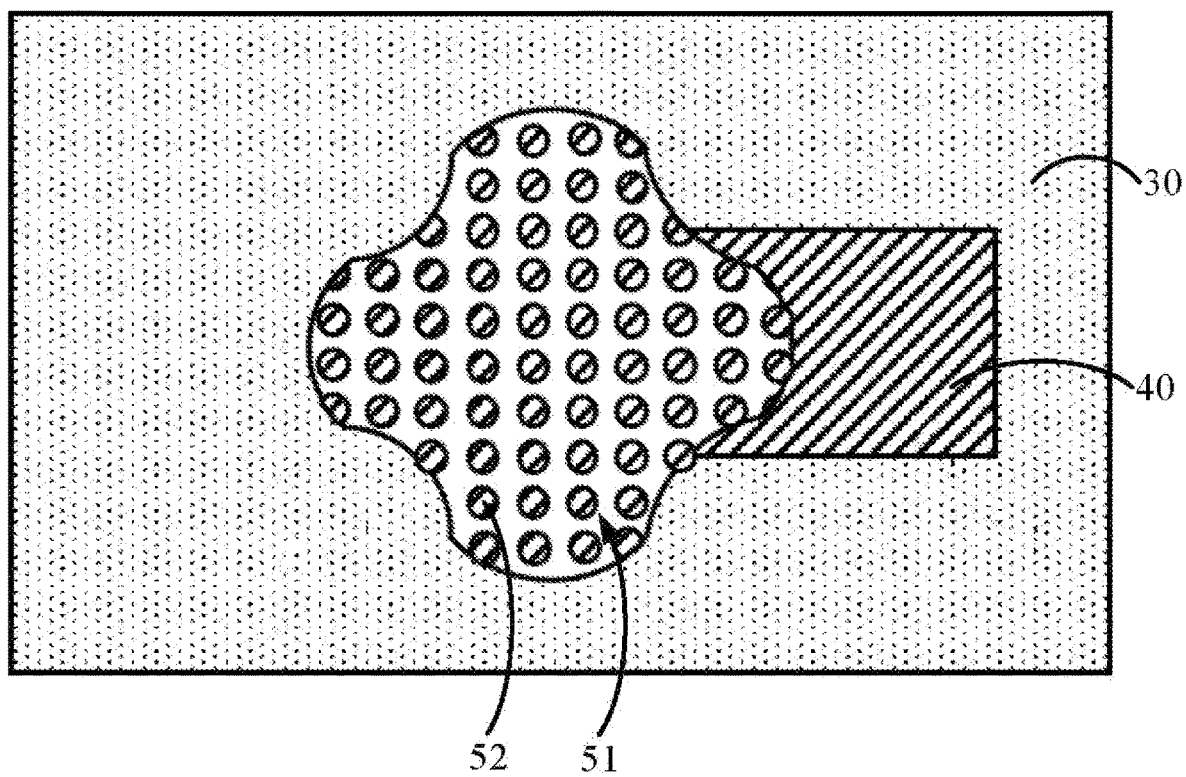
FIG. 4 is a top view of FIG. 2.

Exemplarily, in a second case, as shown in FIG. 3 and FIG. 4, in the resonant region 50, a contour of an orthographic projection of an unetched region 52 on the substrate 10 is a plurality of closed graphs, which are arranged at intervals. That is, the unetched region 52 has a plurality of sub-regions in the resonant region 50, and each sub-region is, spaced apart from each other and is a closed graph.

For example, as shown in FIG. 4, the closed graph of each sub-region may be a circle; as another example, the closed graphs of the plurality, of sub-regions may be a combination of a circle and a closed graph composed of a plurality of arcs (i.e., the closed graphs of some sub-regions are circles, and the closed graphs of some sub-regions are closed graphs composed of a plurality of arcs); as another example, the closed graphs of the plurality of sub-regions may be a combination of a circle and a polygon (i.e., the closed graphs of some sub-regions are circles, and the closed graphs of some sub-regions are polygons); as another example, the closed graphs of the plurality of sub-regions may be a combination of a polygon and a closed graph composed of a plurality of arcs (i.e., the closed graphs of some sub-regions are polygons, and the closed graphs of some sub-regions are closed graphs composed of a plurality of arcs); and in addition, the closed graphs of the plurality of sub-regions may also be a combination of a circle, a polygon and a closed graph composed of a plurality of arcs (i.e., the closed graphs of some sub-regions are circles, the closed graphs of some sub-regions are closed graphs composed of a plurality of arcs, and the closed graphs of some sub-regions are polygons), etc. It should be understood that, the circle, the polygon and the closed graph composed of a plurality of arcs are only an example of the shape of the closed graph, when the contour of the orthographic projection of the unetched region 52 on the substrate 10 is a plurality of closed graphs, which are arranged at intervals, rather than a particular limitation to the form of a solution which the closed graph may support. For example, in other embodiments, the closed graph may also be an irregular graph.

Figure 6:
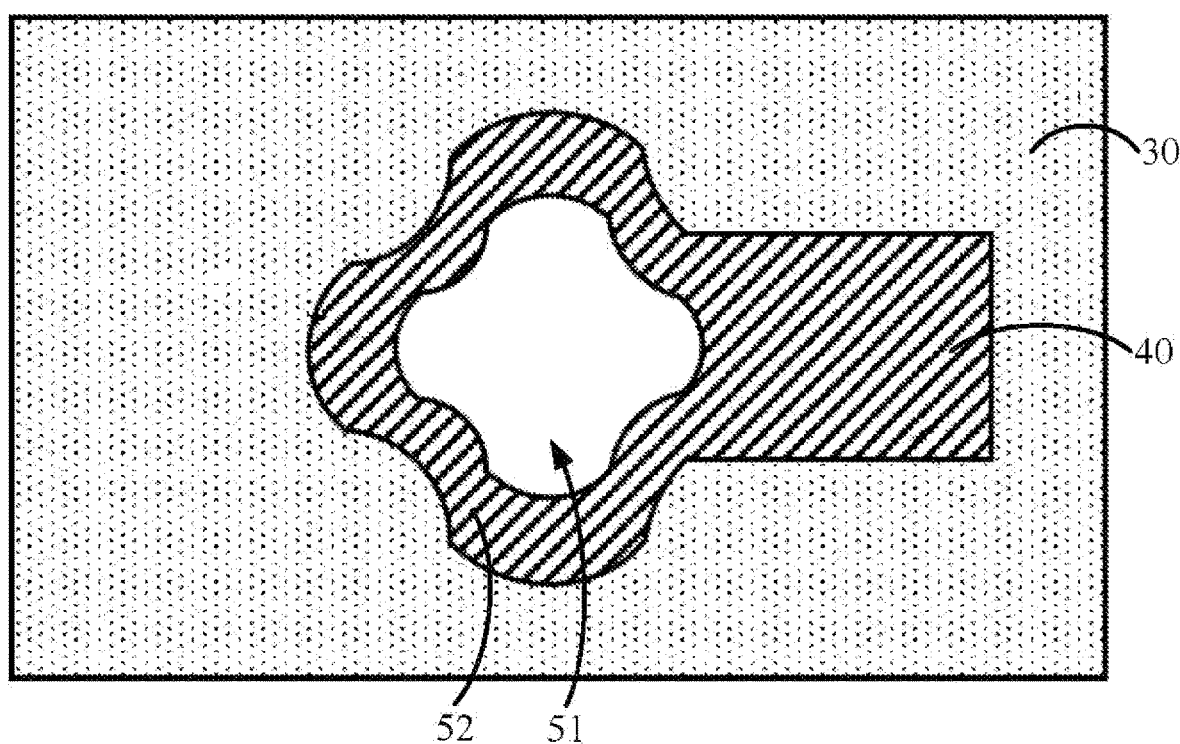
FIG. 6 is a third schematic structural diagram of a resonator provided by some embodiments of the present disclosure.

Exemplarily, in a third case, as shown in FIG. 6, the etched region 51 may also be located in a middle region of the resonant region 50, and a contour of an orthographic projection of the etched region 51 on the substrate 10 is any one of a circle, a closed graph composed of a plurality of arcs, or a polygon. This case corresponds to the first case. In the first case, the etched region 51 is located at the periphery of the resonant region 50, and in this case, the etched region 51 is located in a center region of the resonant region 50. That is to say, it is equivalent to exchange the etched region 51 with the unetched region 52 in the first case. Since the specific form of the first case has been described in detail in the present disclosure, those skilled in the art may deduce, according to the foregoing descriptions, the specific form corresponding to this case, and thus will not be repeatedly described in the present disclosure.

It should be noted that, in the present embodiment, the unetched region 52 refers to a region that is not etched in the resonant region 50, that is, the etched region 51 and the unetched region 52 together constitute the resonant region 50.

Figure 7:
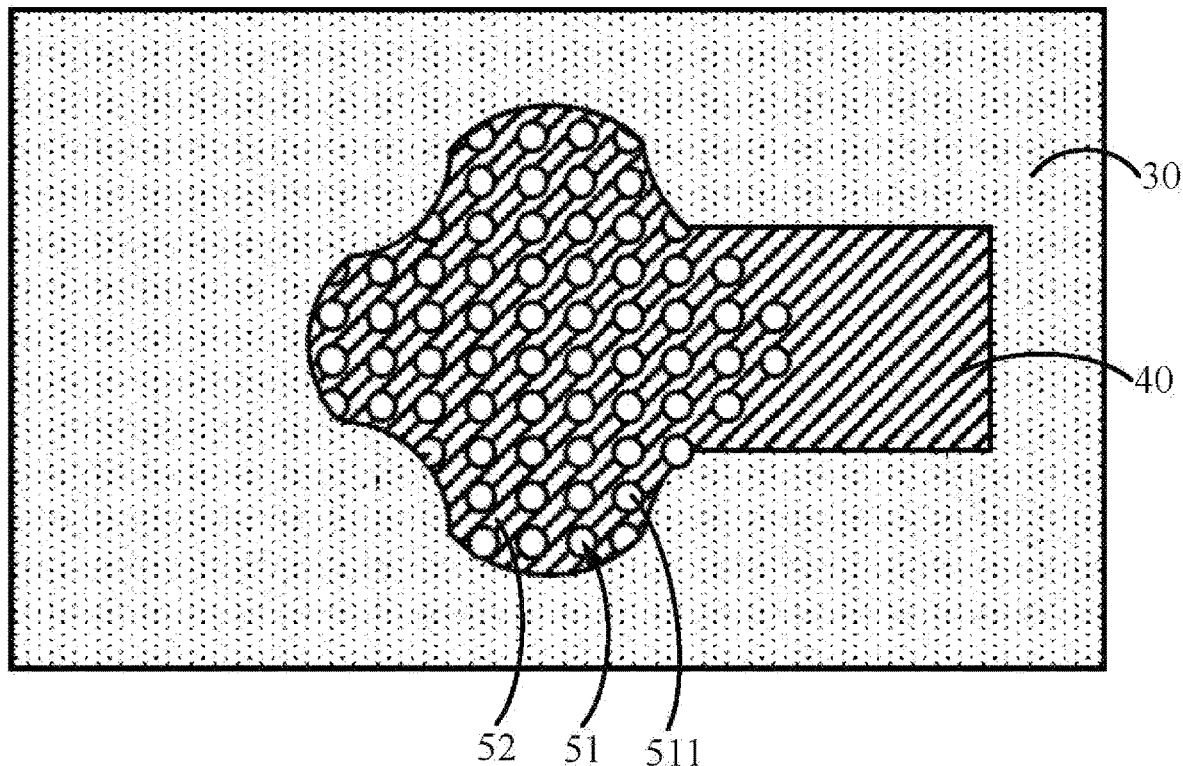
FIG. 7 is a fourth schematic structural diagram of a resonator provided by some embodiments of the present disclosure.

Exemplarily, in a fourth case, as shown in FIG. 7, the etched region 51 includes a plurality of sub-regions 511 arranged at intervals, and a contour of an orthographic projection of the sub-region 511 on the substrate 10 is any one or a combination of at least two of a circle, a closed graph composed of a plurality of arcs, or a polygon. In other words, the etched region 51 may include a plurality of sub-regions 511, and the plurality of sub-regions 511 are arranged at intervals, that is, compared with the second case, this case is equivalent to exchange the etched region 51 with the unetched region 52 in the second case.

The contour of the orthographic projection of the sub-region 511 on the substrate 10 is any one or a combination of at least two of a circle, a closed graph composed of a plurality of arcs, or a polygon. For example, the sub-regions 511 are all circles, the sub-regions 511 are all polygons, and the sub-regions 511 are all closed graphs composed of a plurality of arcs; as another example, some sub-regions 511 are circles, and some sub-regions 511 are polygons; and as another example, some sub-regions 511 are closed graphs composed of a plurality of arcs, and some sub-regions 511 are polygons, and so on, which will not be listed one by one in the present disclosure.

In the present embodiment, the etched layer may be at least one of the upper electrode layer 40, the lower electrode layer 20 and the piezoelectric layer 30; or, the etched layers may be any two of the upper electrode layer 40, the lower electrode layer 20 and the piezoelectric layer 30; or, the etched layers may be the upper electrode layer 40, the lower electrode layer 20 and the piezoelectric layer 30.

Figure 8:
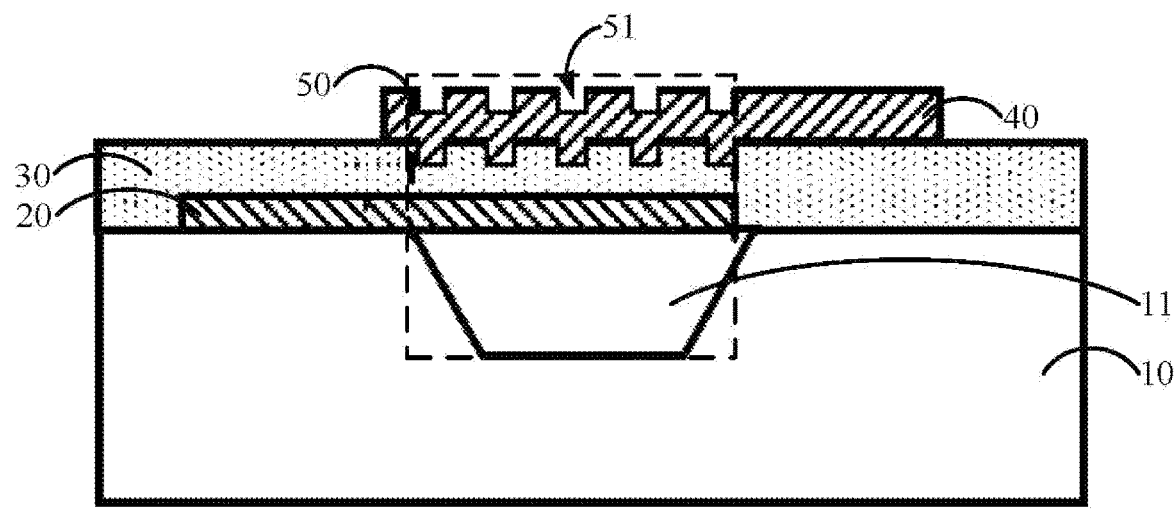
FIG. 8 is a fifth schematic structural diagram of a resonator provided by some embodiments of the present disclosure.

As shown in FIG. 8, in the resonant region 50, surfaces of the upper electrode layer 40 and the piezoelectric layer 30, which are respectively away from the substrate 10, are partially etched. In this way, two etched regions 51 can be obtained, wherein one etched region 51 is located on the upper electrode layer 40, and the other etched region 51 is located on the piezoelectric layer 30. It should be noted that, in this case, the etching depth of each etched region 51 is less than the thickness of the corresponding layer itself, and the etching area of each etched region 51 is less than the area of the resonant region 50.

Figure 9:
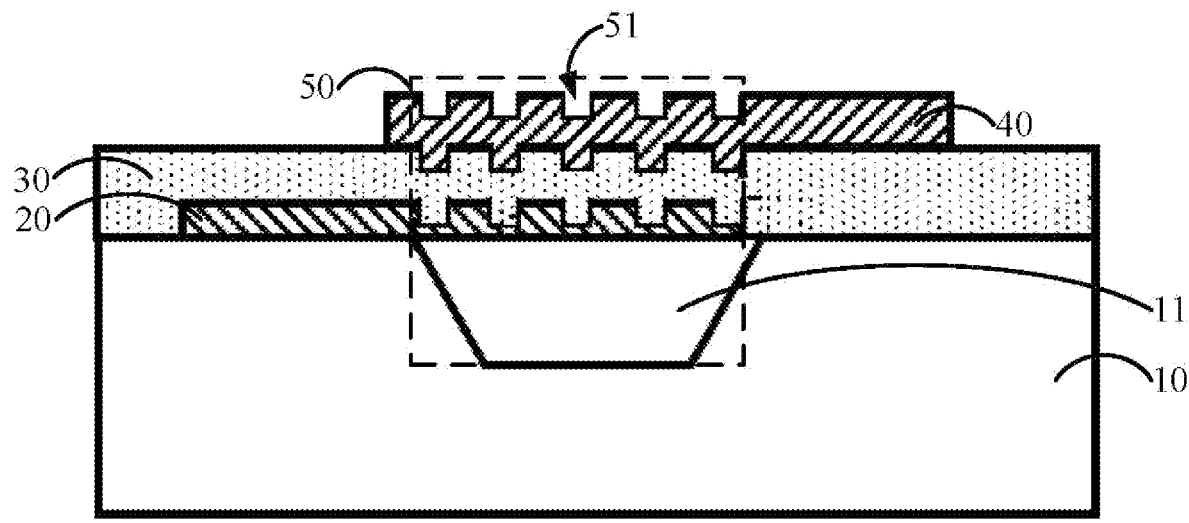
FIG. 9 is a sixth schematic structural diagram of a resonator provided by some embodiments of the present disclosure.

Of course, as shown in FIG. 9, in other embodiments, optionally, in the resonant region 50, the surfaces of the upper electrode layer 40, the piezoelectric layer 30 and the lower electrode layer 20, which are respectively away from the substrate 10, are partially etched. In this way, three etched regions 51 can be obtained, wherein the first etched region 51 is located on the upper electrode layer 40, the second etched region 51 is located on the piezoelectric layer 30, and the third etched region 51 is located on the lower electrode layer 20. Likewise, in this case, the etching depth of each etched region 51 is less than the thickness of the corresponding layer itself, and the etching area of each etched region 51 is less than the area of the resonant region 50.

Figure 10:
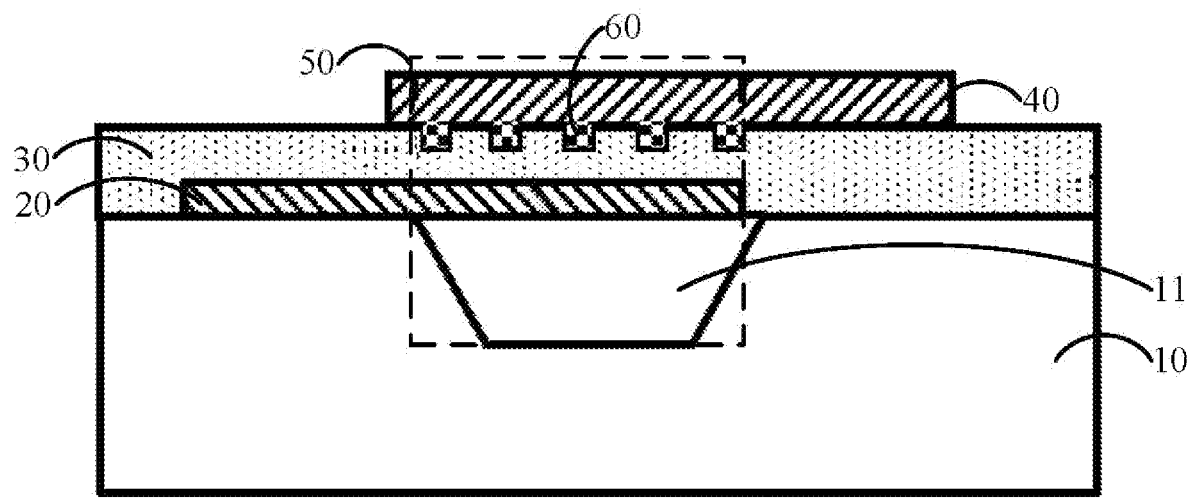
FIG. 10 is a seventh schematic structural diagram of a resonator provided by some embodiments of the present disclosure.

Also, in the present embodiment, as shown in FIG. 10, optionally, in the resonant region 50, the piezoelectric layer 30 is partially etched to form the etched region 51, and the etched region 51 is filled with a material having a positive temperature coefficient. It should be noted that, the material having the positive temperature coefficient is filled in the etched region 51 of the piezoelectric layer 30. In this case, those skilled in the art can choose to etch the upper electrode layer 40 and/or the lower electrode layer 20 as needed, or choose not to etch the upper electrode layer 40 and/or the lower electrode layer 20.

Assuming that the material having the positive temperature coefficient is a first material 60, then exemplarily, the first material 60 may be $SiO_2$. Since main materials constituting the laminated structure of the resonator basically have negative temperature coefficients, by means of adjusting the thickness or area of the material having the positive temperature coefficient (i.e., the first material 60) in the laminated structure, a frequency drift of the resonator with temperature can be effectively reduced, thereby increasing the working temperature range of a filter or a duplexer that is constructed by the resonator.

Figure 11:
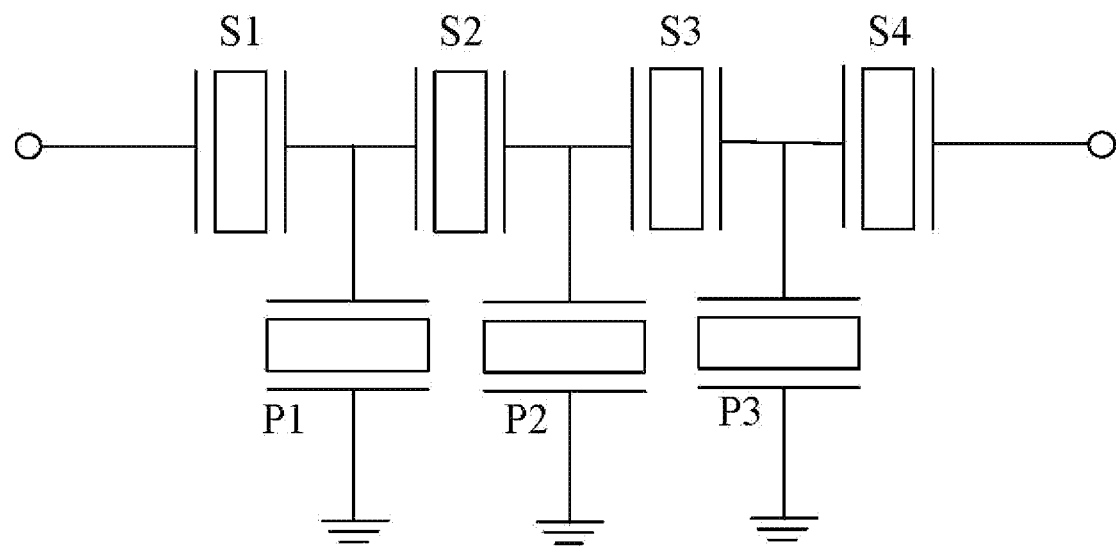
FIG. 11 is a schematic structural diagram of a filter provided by some embodiments of the present disclosure.

As shown in FIG. 11, another aspect of the present disclosure provides a filter, including, at least two resonators mentioned above, wherein the at least two resonators are respectively in respective resonant regions 50, and an area ratio of an etched region 51 and an unetched region 52 of each of the at least two resonators is different from each other.

It should be noted that, the filter may be constructed by two or more resonators mentioned above. The construction modes of the resonator and the filter are well known to those skilled in the art, and thus will be not repeatedly described in the present disclosure. What is shown in FIG. 11 of the present disclosure is only a construction form of the filter, and should not be regarded as a unique limitation to the construction form of the filter in the present disclosure.

In the present embodiment, resonators, in series (i.e., resonators S1, S2, S3 and S4 as shown in FIG. 11) and resonators in parallel (i.e., resonators P1, P2 and P3 as shown in FIG. 11) may have different etching area ratios (i.e., the area ratios of the etched regions 51 to the resonant regions 50 of the resonators in series are different from the area ratios of the etched regions 51 to the resonant regions 50 of the resonators in parallel). In addition, in the present embodiment, optionally, the etching area ratios r of the resonators in series are greater than the etching area ratios of the resonators in parallel, and the etching area ratios r of the resonators in parallel may be zero.

The etched region 51 includes a plurality of sub-regions 11 that are spaced apart from each other and are arranged in parallel. In order to reduce acoustic wave interference between the sub-regions and reduce stray waves, the spacing between the sub-regions 511 is greater than or equal to half of the length of the sub-region 511.

There are two or more etched layers, and area of the etched regions of the etched layers are equal. When there are two or more etched layers, the total etching thickness may be greater than the thickness of single-layer etching, such that an adjusted frequency range can be wider. In addition, the etched parts of the layers have the same area, and the projections on the silicon substrate overlap with each other, such that the types of stacking thicknesses in an active region can be reduced (there are only two thicknesses, that is, the etched region 51 and the unetched region 52), thereby better facilitating to control stray waves caused by different thicknesses, and reducing the influence on device performance.

The projections of the etched regions 51 on the substrate 10 overlap with each other.

The lower electrode layer 20 is provided with an inclination angle, and the inclination angle ranges from 15° to 30°.

The upper electrode layer 40 is provided with an inclination angle, and the inclination angle ranges from 80° to 90°.

In this way, in the present disclosure, by means of controlling the etching area ratio of the etched region 51 to the resonant region 50 of each resonator on the wafer, a plurality of different resonant frequencies can be obtained, thereby effectively increasing the flexibility of designing the filter.

Figure 12:
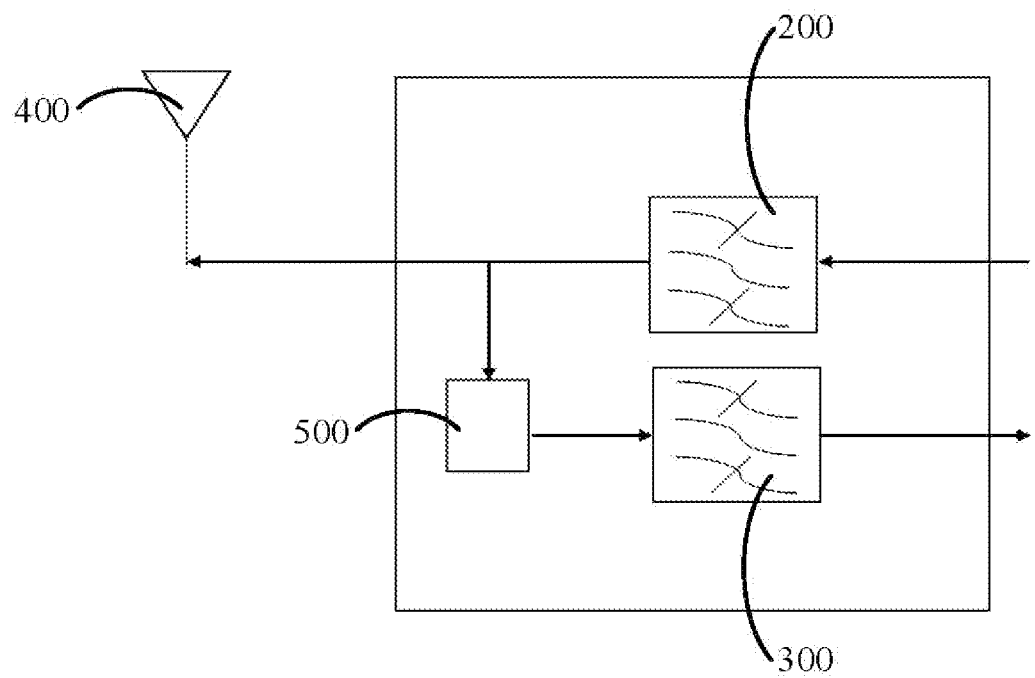
FIG. 12 is a schematic structural diagram of a duplexer provided by some embodiments of the present disclosure.

As shown in FIG. 12, yet another aspect of the present disclosure provides a duplexer, including a transmitting filter 200 and a receiving filter 300, wherein the transmitting filter 200 and/or the receiving filter 300 is the above filter. The specific structure of the filter and effective effects thereof have been described in detail above, and thus will not be repeatedly described herein.

In the present embodiment, the duplexer further includes an antenna 400 and a phase shifter 500. The construction modes of the antenna 400, the phase shifter 500, the transmitting filter 200 and the receiving, filter 300 are well known to those skilled in the art, and thus will not be repeatedly described herein.

The above descriptions are only optional embodiments of the present disclosure, and are not intended to limit the present disclosure. For those skilled in the art, the present disclosure may have various modifications and changes. Any modifications, equivalent replacements, improvements, and the like, made within the spirits and principles of the present disclosure, shall be included in the protection scope of the present disclosure.

In addition, it should be noted that, the specific technical features described in the above-mentioned specific embodiments may be combined in any suitable manner under the condition of no contradiction. In order to avoid unnecessary repetition, various possible combination modes will not be explained separately in the present disclosure.

The invention claimed is:

1. A resonator, comprising: a substrate, and a lower electrode layer, a piezoelectric layer and an upper electrode layer, which are sequentially formed on the substrate, wherein an acoustic reflection structure is formed on a surface of the substrate that is close to the lower electrode layer, and an overlapping region of the acoustic reflection structure, the lower electrode layer, the piezoelectric layer and the upper electrode layer along a stacking direction forms a resonant region; and in the resonant region, a surface, which is away from the substrate, of at least the lower electrode layer is etched to form an etched region, a depth of the lower electrode layer to be etched is less than a thickness of an etched layer, and a area of the etched region of the lower electrode layer to be etched is less than a area of the resonant region.

2. The resonator according to claim 1, wherein the etched region is located at a periphery of the resonant region; and in the resonant region, a contour of an orthographic projection of an unetched region on the substrate is any one of a circle, a closed graph composed of a plurality of arcs, or a polygon.

3. The resonator according to claim 1, wherein in the resonant region, a contour of an orthographic projection of an unetched region on the substrate is a plurality of closed graphs, which are arranged at intervals.

4. The resonator according to claim 1, wherein the etched region is located in a middle region of the resonant region, and a contour of an orthographic projection of the etched region on the substrate is any one of a circle, a closed graph composed of a plurality of arcs, or a polygon.

5. The resonator according to claim 1, wherein the etched region comprises a plurality of sub-regions arranged at intervals, and a contour of an orthographic projection of the sub-region on the substrate is any one or a combination of at least two of a circle, a closed graph composed of a plurality of arcs, or a polygon.

6. The resonator according to claim 1, wherein in the resonant region, surfaces of the upper electrode layer and the piezoelectric layer, which are respectively away from the substrate, are partially etched.

7. The resonator according to claim 1, wherein in the resonant region, surfaces of the upper electrode layer, the piezoelectric layer and the lower electrode layer, which are respectively away from the substrate, are partially etched.

8. The resonator according to claim 1, wherein in the resonant region, the piezoelectric layer is partially etched to form the etched region, and the etched region is filled with a material having a positive temperature coefficient.

9. The resonator according to claim 1, wherein the upper electrode layer is provided with an inclination angle, and the inclination angle ranges from 80° to 90°.

10. The resonator according to claim 1, wherein the lower electrode layer is provided with an inclination angle, and the inclination angle ranges from 15° to 30°.

11. The resonator according to claim 8, wherein the etched region comprises a plurality of sub-regions that are spaced apart from each other and are arranged in parallel, and a spacing between the sub-regions is greater than or equal to half of a length of the sub-region.

12. The resonator according to claim 8, wherein there are two or more etched layers, and areas of the etched regions of the etched layers are equal.

13. The resonator according to claim 12, wherein the projections of the etched regions on the substrate overlap with each other.

14. A filter, comprising at least two resonators according to claim 1, wherein the at least two resonators are respectively in respective resonant regions, and an area ratio of an etched region and an unetched region of each of the at least two resonators is different from each other.

15. The filter according to claim 14, wherein the etched region comprises a plurality of sub-regions that are spaced apart from each other and are arranged in parallel, and a spacing between the sub-regions is greater than or equal to half of a length of the sub-region.

16. The filter according to claim 15, wherein there are two or more etched layers, and areas of the etched regions of the etched layers are equal.

17. The filter according to claim 15, wherein the projections of the etched regions on the substrate overlap with each other.

18. The filter according to claim 15, wherein the lower electrode layer is provided with an inclination angle, and the inclination angle ranges from 15° to 30°.

19. The filter according to claim 15, wherein the upper electrode layer is provided with an inclination angle, and the inclination angle ranges from 80° to 90°.

20. A duplexer, comprising a transmitting filter and a receiving filter, wherein the transmitting filter and/or the receiving filter is the filter according to claim 14.

* * * * *